United States Patent [19]

Coudenys et al.

[11] Patent Number: 5,388,548
[45] Date of Patent: Feb. 14, 1995

[54] METHOD OF FABRICATING OPTOELECTRONIC COMPONENTS

[75] Inventors: Geert F. M. Coudenys, Kortrijk; Piet P. A. R. Demeester, Wondelgem, both of Belgium

[73] Assignee: Interuniversitair Micro-Elektronica VZW, Leuven, Belgium

[21] Appl. No.: 170,349
[22] PCT Filed: Apr. 22, 1993
[86] PCT No.: PCT/BE93/00019
§ 371 Date: Apr. 11, 1994
§ 102(e) Date: Apr. 11, 1994
[87] PCT Pub. No.: WO93/22793
PCT Pub. Date: Nov. 11, 1993

[30] Foreign Application Priority Data

Apr. 29, 1992 [BE] Belgium ............................ 09200394

[51] Int. Cl.$^6$ ......................................... H01L 21/20
[52] U.S. Cl. .................................. 117/89; 117/90; 117/95; 117/105; 117/923; 437/129
[58] Field of Search ............... 117/90, 89, 95, 105, 117/923; 437/129

[56] References Cited

U.S. PATENT DOCUMENTS 5,212,113  5/1993  Azoulay et al. ..................... 437/126

OTHER PUBLICATIONS

G. Coudenys et al. "Lateral Bandgap Engineering for InP-Based Photonic Integrated Circuits," 4th International Conf. on Indium Phosphide and Related Materials, 21 Apr. 1992, Newport, USA, pp. 202-205.

M. Takahashi et al. "In-Plane Quantum Energy Control of InGaAs/InGaAsP MQW Structure by MOCVD Selective Area Growth," 4th International Conf. on Indium Phosphide and Related Materials, 21 Apr. 1992, Newport, USA, pp. 206-209.

E. Veuhoff et al. "Improvements in Selective Area Growth of InP Metalorganic Vapor Phase Epitaxy," 4th International Conf. on Indium Phosphide and Related Materials, 21 Apr. 1992, Newport, USA, pp. 210-3.

I. Moerman et al. "Characterization of InP/InGaAs/InGaAsP Using Atmospheric and Low Pressure MOVPE," 3rd International Conf. on Indium Phosphide and Related Materials, vol. 1, 8 Apr. 1991, Cardiff, Wales, UK p. 132.

P. Demeester et al. "Non-Planar MOVPE Growth Using a Novel Shadow-Masking Technique," J. Crystal Growth vol. 107, No. 1/4, Jan. 1991 pp. 161-165.

G. Coudenys et al. "Selective and Shadow MOVPE Growth of InP/InGaAs(P) Heterostructures and Quantum Wells," J. Crystal Growth vol. 124, No. 1/4, Nov. 1992, pp. 497-501.

P. Demeester et al. "Growth Velocity Variations During Metalorganic Vapor Phase Epitaxy Through an Epitaxial Shadow Mask," Appl. Phys. Lett. vol. 57, No. 2, 9 Jul. 1990, pp. 168-170.

T. Iwasaki et al. "Selective MOCVD Growth for Application to GaAs/AlGaAs Buried Heterostructure Lasers," Japanese J. Appl. Physics vol. 25, No. 1, Jan. 1986, pp. L66-L69.

G. Vermeire et al. "Broad Band Side-Emitting GaAs-/AlGaAs/InGaAs Single Quantum Well LED's," 18th International Symposium on Gallium Arsenide and Related Compounds, 9 Sep. 1991, Seattle, USA, pp. 499-504.

C. H. Joyner et al. "Extremely Large Band Gap Shifts for MQW Structures by Selective Epitaxy on SiO$_2$ Masked Substrates," IEEE Photonics Technology Letters vol. 4, No. 9, Sep. 1992, pp. 1006-1009.

Y. L. Wang et al. "Optical and Electrical Properties of InP/InGaAs Grown Selectively on Sio$_2$-Masked InP," Appl. Phys Lett. 59 (4), 22 Jul. 1991, pp. 443-445.

Primary Examiner—R. Bruce Breneman
Assistant Examiner—Linda J. Fleck
Attorney, Agent, or Firm—Allegretti & Witcoff, Ltd.

[57] ABSTRACT

A method of fabricating a plurality of optoelectronic components on a semiconductor substrate, each optoelectronic component comprising several layers grown in a reactor. Every layer is being grown under a predetermined individual pressure. The active layers of all the components are lying substantially at the same height. Control of the pressure in the reactor during growth allows the thickness of the layer grown to be constant or to vary over the substrate area.

6 Claims, 2 Drawing Sheets

METHOD OF FABRICATING OPTOELECTRONIC COMPONENTS

FIELD OF THE INVENTION

The invention relates to the fabrication of optoelectronic components and in particular photonic integrated circuits.

BACKGROUND OF THE INVENTION

Photonic integrated circuits (PIC) are semiconductor chips that include several optoelectronic components (e.g. semiconductor lasers, detectors, waveguides, FET devices, etc.). Such chips can be fabricated using various techniques that have been developed for the individual components. However, because each different component (e.g. a laser and a waveguide) requires a different layer structure, that is a stack of several layers having different thicknesses and compositions, the fabrication of PIC's using these known different techniques requires many processing and growth steps.

More advanced techniques have been disclosed in the literature that make it possible to grow the layers for the different components over the surface of a substrate in a single run. This can be done by controlling the lateral variations in the growth rate over the surface of the substrate, thereby to change the bandgap of the quantum wells in a controllable way laterally over the surface of the substrate. These advanced techniques include selective growth, shadow masked growth and non-planar growth using Metal Organic Chemical Vapour Deposition (MOCVD) growth in a reactor.

For growing high quality layers, the right growth conditions are chosen so as to obtain the best layers. The growth parameters include the temperature, pressure, gas flow.

Using the known techniques provides chips including several devices that consist each of a stack of several layers having different thicknesses and compositions. The composition within a few atomic layers can be changed by changing the gas that is switched to the MOCVD reactor.

As noted above, the growth rate can be controlled for each device over the surface of the substrate and this results in a complete integrated chip including devices in which the active layers are not lying at the same height. Such a structure has some disadvantages in that the coupling between different devices (e.g. a laser and a semiconductor waveguide) is not perfect and the overall surface is not planar.

SUMMARY OF THE INVENTION

It is an object of the present invention to provide an improved growth technique that results in a chip structure wherein the active layers are all lying at the same height while being grown in a single growth run.

This object is achieved according to this invention by a growth method using a MOCVD growth in a reactor in which the pressure is maintained at a different value for growing each individual layer. In particular, a method is provided for fabricating a plurality of optoelectronic components including several layers grown on a semiconductor substrate in a reactor. Every layer is being grown under a predetermined individual pressure whereby the active layers of all the components are lying substantially at the same height.

This invention makes it possible for instance to grow simultaneously a plurality of first layers having an equal thickness over the entire area of a substrate using a low pressure, then second epitaxial layers having different thicknesses using an atmospheric pressure, and then again epitaxial layers having an equal thickness using a low pressure, thereby to realize a layer structure in which all active layers are lying at the same height over the area of the substrate.

The invention will be more readily understood by reference to the drawings and the description of two exemplary embodiments.

DESCRIPTION OF TWO EXEMPLARY EMBODIMENTS

EXAMPLE 1

Fabrication of an integrated chip including a semiconductor laser coupled to a waveguide by means of shadow masked growth.

Figure 1:
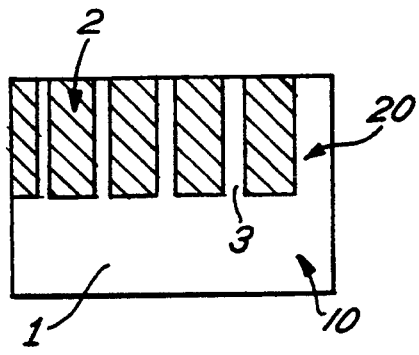
FIG. 1 shows a semiconductor substrate to be processed together with a shadow mask.
Figure 2:
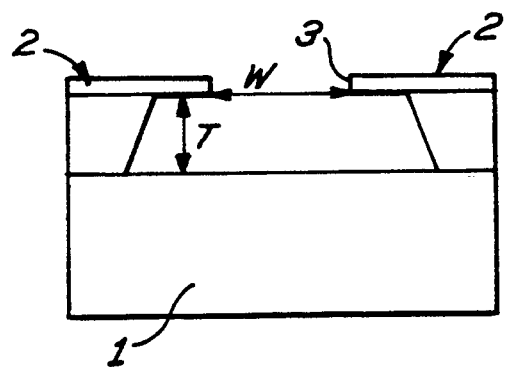
FIG. 2 is a cross-sectional view across a channel in the mask shown in FIG. 1.

Referring to FIG. 1, the purpose in this example is to have the structures of a laser 10 and a waveguide 20 to be epitaxially grown on a semiconductor substrate 1 in one single growth run. Quantum wells are used in the active layer because a quantum well is sensitive to the thickness variations and allows the thickness variations to be translated into a material bandgap change. In order to cause the waveguide to be transparent to laser light, the quantum wells in the waveguide 20 should be made thinner than in the laser 10. This can be done by growing the laser 10 over a substrate portion not covered by a mask and growing the waveguide 20 using the shadow mask 2 forming uncovered channels 3. FIG. 2 shows a cross-sectional view across such a channel.

The growth rate in a channel can be varied by changing the structure geometry (depth of well and width of aperture above a well). For instance, reducing the width W of the aperture makes it to reduce the growth rate.

Figure 3:
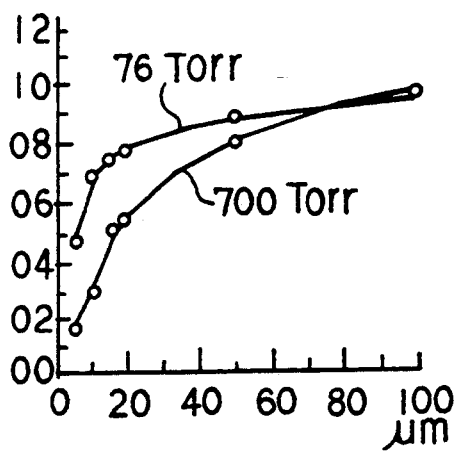
FIG. 3 is a diagram showing the variation in growth rate as a function of the channel width (shadow masked growth).

The growth rate is varying with the channel width as can be seen from FIG. 3 which shows the growth rate variation as a function of the channel width at low pressure (76 Torr) and atmospheric pressure (700 Torr) during growth with a fixed 6-micron well depth. Assuming a 20-micron width for the channels, FIG. 3 shows that the thickness of the grown structure is reduced by ±50% when growth is done at atmospheric pressure. This result is quite satisfactory for allowing the quantum wells in the waveguide 20 to be transparent to the laser light.

Figure 4:
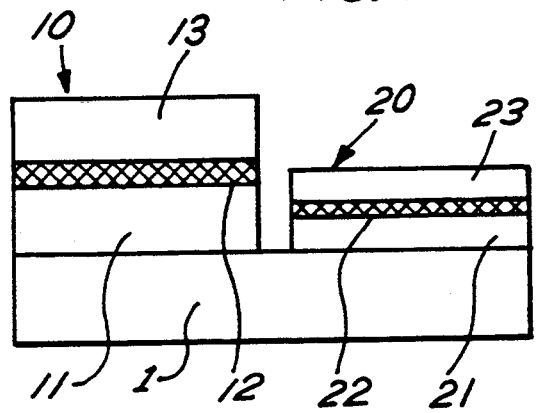
FIGS. 4 and 5 show the layer structures for a laser and a waveguide device grown according to the prior art and the invention respectively.

However, when the complete structure is grown under atmospheric pressure in a reactor, the resulting structure looks as shown in FIG. 4. The active layers 12 and 22 in the laser structure 10 and the waveguide structure 20 respectively are not lying at the same height because the thickness of the active layers as well as of the adjacent cladding layers 11, 13, 21, 23 is reduced by the same factor. Such a result is avoided when growing the structure in accordance with the invention.

Figure 5:
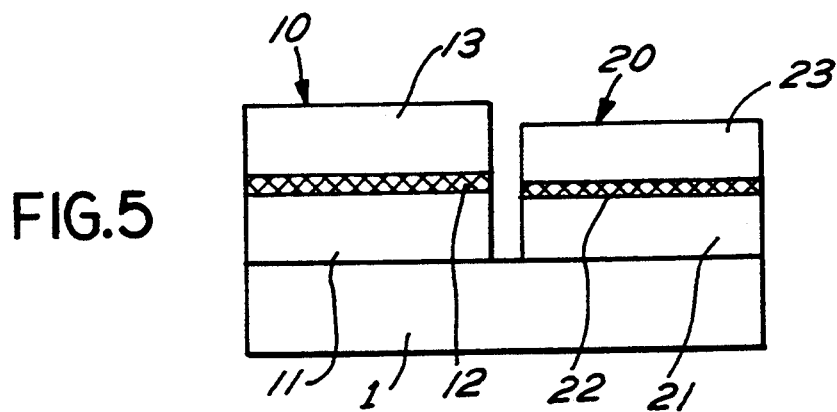

According to this invention, the pressure in the reactor is changed during growth thereby to selectively control the growth rate of each individual layer. The lower cladding layers 11, 21 are grown at low pressure whereby the growth rate in the micron channel 33 is reduced by ±20% only relative to the growth rate in device 20. Thereafter, growth is being proceeded further under atmospheric pressure whereby the active layers 12, 22 are grown at a strongly reduced rate. Finally, growth is done again under low pressure thus resulting in grown upper cladding layers 13, 23 being thicker. The structure thus obtained looks as shown in FIG. 5: the active layers 12 and 22 of the laser and the waveguide respectively are lying at the same height, thereby resulting in a much better coupling between the two devices than when growth is proceeded in accordance with the prior art.

EXAMPLE 2

Fabrication of a row of lasers emitting light at different wavelengths by means of selective growth.

Figure 6:
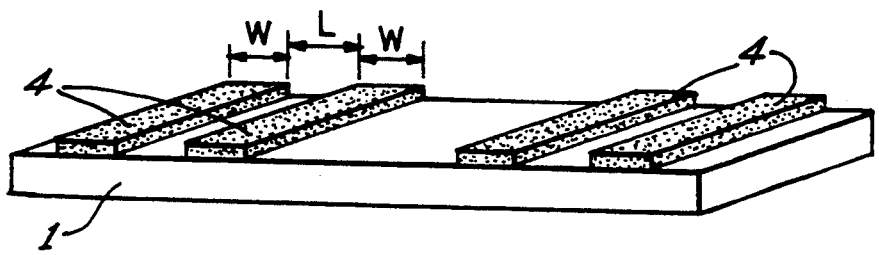
FIG. 6 schematically shows a mask for selective growth.
Figure 7:
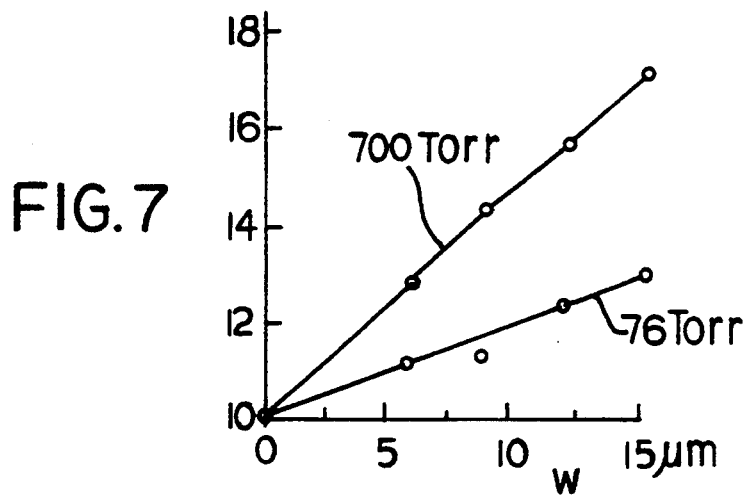
FIG. 7 is a diagram showing the normalized thickness as a function of the width of the oxide strips in the mask shown in FIG. 6 (selective growth).

The surface of substrate 1 is covered with spaced apart oxide strips 4 whereby growth of the layer is locally prevented (FIG. 6). The material that comes onto the oxide will diffuse to the uncovered zones thus resulting in an increase in the growth rate there. This method is used for causing the growth rate to vary over the area of the substrate. FIG. 7 shows the variation in growth rate as a function of the width W of the oxide strips with a mask having oxide strips equally spaced apart by an 8-micron distance L.

Figure 8:
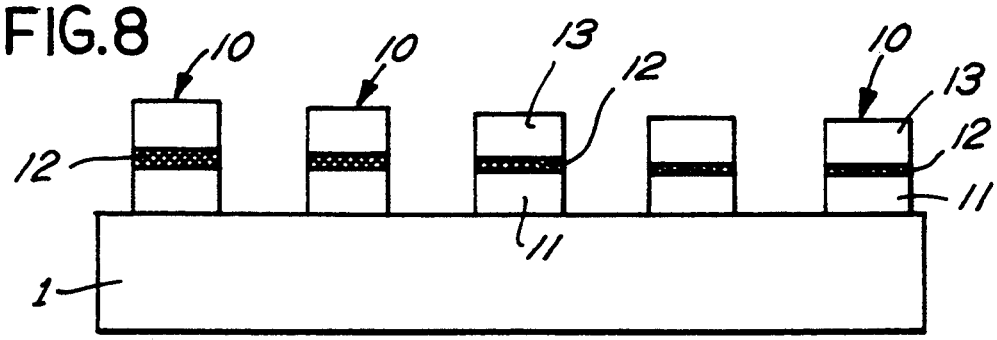

According to this invention, the row of lasers are grown in one single growth run using quantum wells in the active layers of the lasers 10 and using different widths W for the oxide strips over the area of substrate 1 to allow selective growth. In this example too, the lower cladding layers 11 are grown under low pressure, then the active layers 12 are grown under atmospheric pressure whereby the active layer in the individual lasers are selectively grown at an individual reduced growth rate. Thereafter growth is done again under low pressure for growing the upper cladding layers 13. The structure thus obtained looks as shown in FIG. 8. It should be recognized that, in this example too, all the active layers 12 are lying at the same height.

Figure 9:
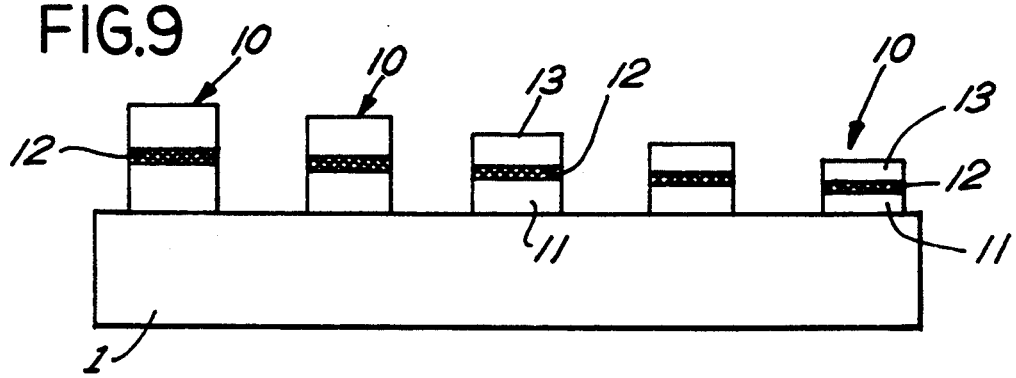
FIGS. 8 and 9 show the layer structure for a row of laser devices grown according to the invention and the prior art respectively.

On the contrary, should growth be done under atmospheric pressure only for achieving the complete structure, the active layers of the individual lasers would be lying at different heights as illustrated in FIG. 9.

It is to be understood that the embodiments described in the foregoing are examples only for the purpose of illustrating how the method of the invention is carried out.

We claim:

1. A method of fabricating a plurality of optoelectronic devices on a semiconductor substrate using epitaxial growth, comprising the steps of:
    covering the semiconductor substrate partially with a mask to form uncovered growing sections and covered sections distributed over the area of the semiconductor substrate,
    placing the assembly in a reactor for growing epitaxial layers onto said semiconductor substrate,
    controlling the pressure in the reactor at a first predetermined individual value for growing simultaneously a first layer of all the devices,
    during growth, changing the pressure to a predetermined individual value for simultaneously growing a second epitaxial layer of all the devices,
    repeatedly changing the pressure to a predetermined individual value for simultaneously growing each further epitaxial layer of all the devices until the structure is complete, so that the active layers of all the components of the structure are lying substantially at the same height over the entire area of the substrate.

2. The method as defined in claim 1, wherein the step of covering the semiconductor substrate consists in placing a plurality of shadowing strips over a portion of the area of the semiconductor substrate, said shadowing strips being equally spaced thereby to allow shadowed mask growth.

3. The method as defined in claim 1, wherein the step of covering the semiconductor substrate consists in placing a plurality of shadowing strips over the entire area of the semiconductor substrate, said shadowing strips having different widths thereby to allow selective growth.

4. The method as defined in claim 1, wherein first layers are being grown on the substrate under low pressure, second active layers are being grown on the respective first layers under atmospheric pressure and third layers are being grown on the respective second layers under low pressure.

5. The method as defined in claim 2, wherein first layers are being grown on the substrate under low pressure, second active layers are being grown on the respective first layers under atmospheric pressure and third layers are being grown on the respective second layers under low pressure.

6. The method as defined in claim 3, wherein first layers are being grown on the substrate under low pressure, second active layers are being grown on the respective first layers under atmospheric pressure and third layers are being grown on the respective second layers under low pressure.

* * * * *